United States Patent [19]

Matsuoka

[11] Patent Number: 5,028,985
[45] Date of Patent: Jul. 2, 1991

[54] IC CARRIER

[75] Inventor: Noriyuki Matsuoka, Tokyo, Japan

[73] Assignee: Yamaichi Electric Mfg. Co., Ltd., Tokyo, Japan

[21] Appl. No.: 513,948

[22] Filed: Apr. 24, 1990

[30] Foreign Application Priority Data

Apr. 28, 1989 [JP] Japan .................... 1-110897

[51] Int. Cl.⁵ .................. H01L 23/02; H01L 23/12; H01L 23/42; H01L 23/44
[52] U.S. Cl. .................................. 357/74; 357/68; 357/79; 357/80; 361/392; 361/421; 174/52.4
[58] Field of Search .................. 357/74, 79, 80, 68, 357/69, 70; 361/392, 421; 174/52.4

[56] References Cited

U.S. PATENT DOCUMENTS

| 4,381,131 | 4/1983 | Demnianiuk | 357/79 |
| 4,435,724 | 3/1984 | Ralstin | 357/79 |
| 4,547,794 | 9/1987 | Tang | 357/70 |
| 4,745,456 | 5/1988 | Clemens | 357/79 |
| 4,887,149 | 12/1989 | Romano | 357/81 |

FOREIGN PATENT DOCUMENTS 0278159 12/1986 Japan ..................... 357/79

Primary Examiner—Rolf Hille
Assistant Examiner—David Ostrowski
Attorney, Agent, or Firm—Wenderoth, Lind & Ponack

[57] ABSTRACT

In an IC carrier for carrying thereon an IC package so as to facilitate transferring of the IC package, a contact insertion space is formed between an IC contact piece and a supporting seat of a frame which supports IC contact pieces which project sideways from the IC package. The insertion space opens in such a manner as to allow insertion of the contact of an IC socket. In this manner, a contact inserted into the contact insertion space presses downwardly against the IC contact piece so as to cause contact between the IC contact piece and the contact.

13 Claims, 3 Drawing Sheets

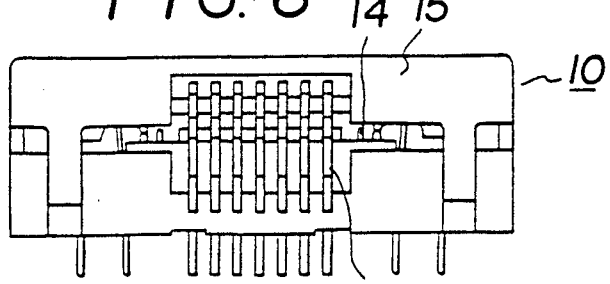
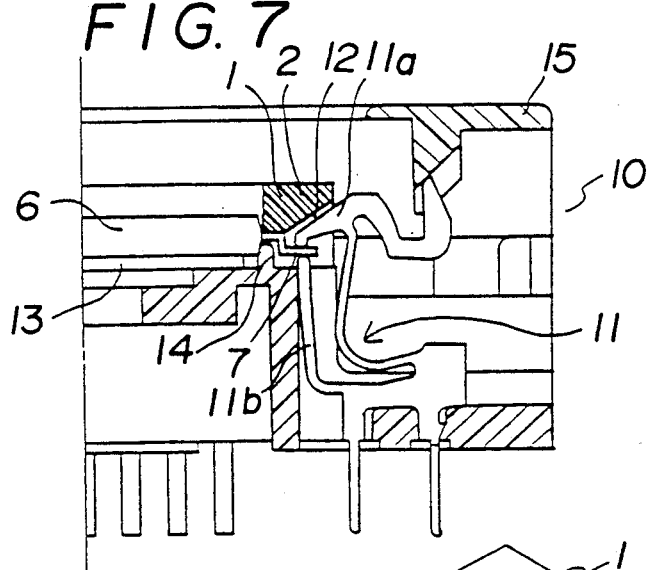
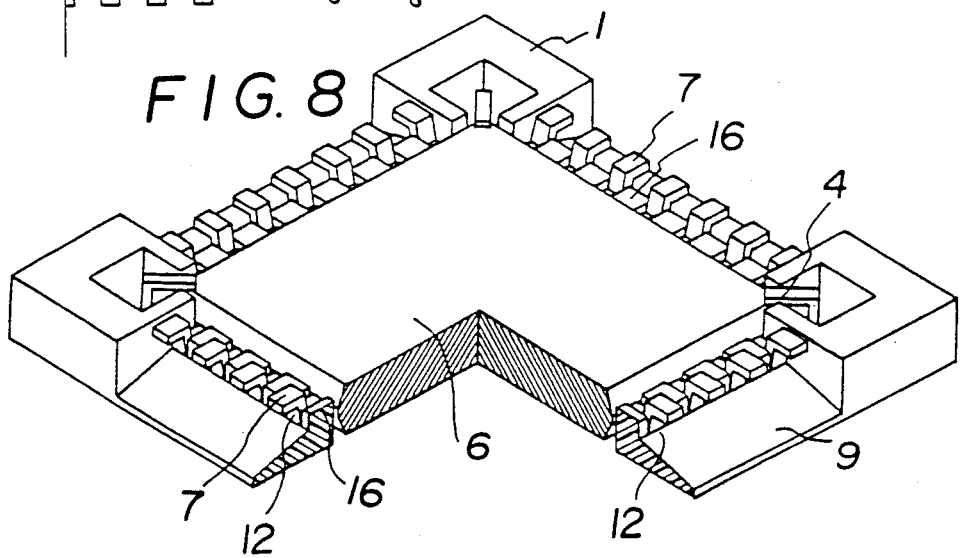

IC CARRIER

BACKGROUND OF THE INVENTION

1. Field of the Invention

This invention relates to an IC carrier for carrying thereon an IC package so as to facilitate transferring, measuring and the like of the IC package.

2. Brief Description of the Prior Art

In a conventional flat type IC package, etc., having IC contact pieces projecting sideways therefrom, an IC carrier for carrying thereon the IC package is inverted and mounted on an IC socket. After the IC contact piece is placed on a contact, which is elastically displaceable in the vertical direction and held by the IC socket, a presser cover disposed on the IC socket is closed and locked by a lock member, and the IC carrier together with the contact piece are urged against the contact. Accordingly, it is inconvenient to use in that it is difficult to automate the work of engaging and disengaging a lock lever, and opening and closing an IC presser cover to mount and remove the IC carrier to and from the IC socket. Additionally, heat release of the IC package is not satisfactory because the IC package is covered with the presser cover.

There is also another conventional IC carrier in which the carrier also acts as the presser cover. However, it also has disadvantages in that heat release is not satisfactory, and in that high weight and a large outer appearance are unavoidable because the carrier is required to be of a sufficient strength.

The present invention has been accomplished in order to eliminate the above-mentioned disadvantages.

SUMMARY OF THE INVENTION

It is therefore a general object of the present invention to provide an IC carrier which is compact and for which work thereon can be automated such as by using, for example, a robot.

Another object of the present invention is to provide an IC carrier, in which heat release by the IC package is satisfactory.

As means for achieving the above-mentioned objects, according to the present invention, a contact insertion space opening up in an inserting direction of a contact of an IC socket, etc. is provided between a frame for forming a supporting seat of an IC contact piece projecting sideways of the IC package and the IC contact insertion space presses the IC contact piece to realize a contact relation. The supporting seat may be provided on an external edge thereof with a tapered portion which gradually slopes downwardly toward the outside of the frame.

In this case, the contact insertion space is formed between the tapered portion and the IC contact piece.

According to the present invention, by virtue of the provision of a contact insertion space between the frame for supporting the IC contact piece of the IC carrier and the IC contact piece, the contact is inserted into and removed from the contact insertion space and the contact is caused to press downwardly against the upper surface of the IC contact piece in order to realize a contacted state.

In this manner, the IC package is held between the contact and the socket, and the IC carrier is held by the socket through the IC package. Therefore, the pressure cover and the lock member as used in the prior art can be omitted.

Furthermore, because of its elasticity, the contact can be displaced forward and backward when it is inserted into and removed from the contact insertion space. This kind of displacing operation can be performed by a robot, etc.

BRIEF DESCRIPTION OF THE DRAWINGS

The above and other objects and features of the present invention will become manifest to those skilled in the art from the following detailed description of the preferred embodiment, reference being made to the accompanying drawings, in which:

FIG. 6 is a side view thereof;

FIG. 7 is a sectional view thereof; and

FIG. 8 is a perspective view, partly in section, showing another embodiment in which the IC package is already mounted on the IC carrier.

DETAILED DESCRIPTION OF THE EMBODIMENT

The embodiment of the present invention will be described in detail with reference to FIGS. 1 through 8.

Figure 1:
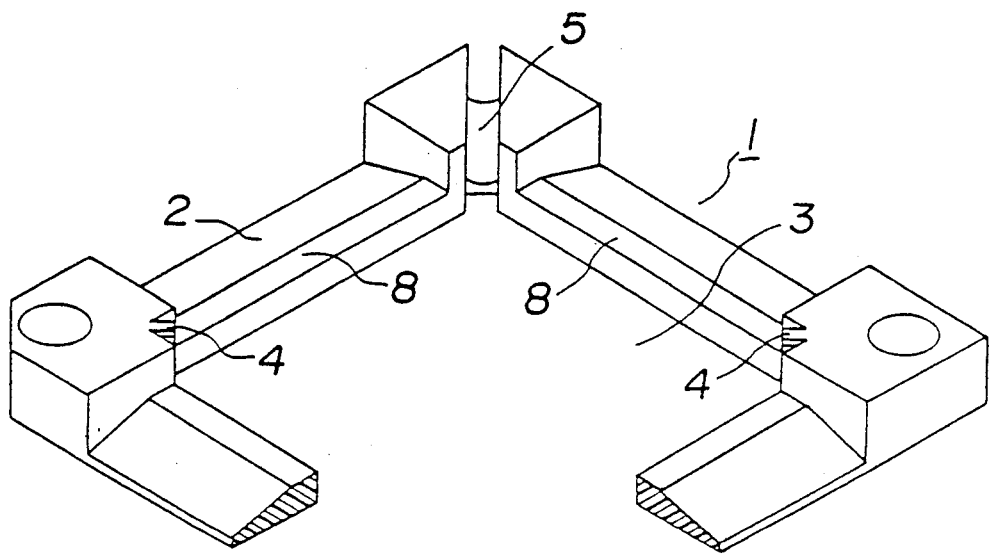
FIG. 1 is a perspective view, partly in section, showing one embodiment of the present invention.

FIG. 1 is a perspective view, partly in section, showing an IC carrier according to one embodiment of the present invention. The numeral 1 denotes an IC carrier formed of a generally square-shaped frame 2 which has a square IC package accommodating portion 3 formed in its central portion.

The IC carrier 1 has retaining claws 4 formed on one set of diametrically opposite corners and adapted to hold the IC package, and has U-shaped grooves 5 formed on the other set of diametrically opposite corners and adapted to allow elastic deformation of the IC carrier 1 about a diagonal line.

Each side of the frame 2 defining the generally square IC package accommodating portion 3 has a contact piece supporting seat 8 formed thereon along the upper surface of the frame 2 and adapted to support an IC contact piece 7 of the IC package 6. Furthermore, the contact piece supporting seat 8 has a tapered portion 9 formed on an external edge thereof which gradually lowers toward the outside of the frame.

Figure 2:
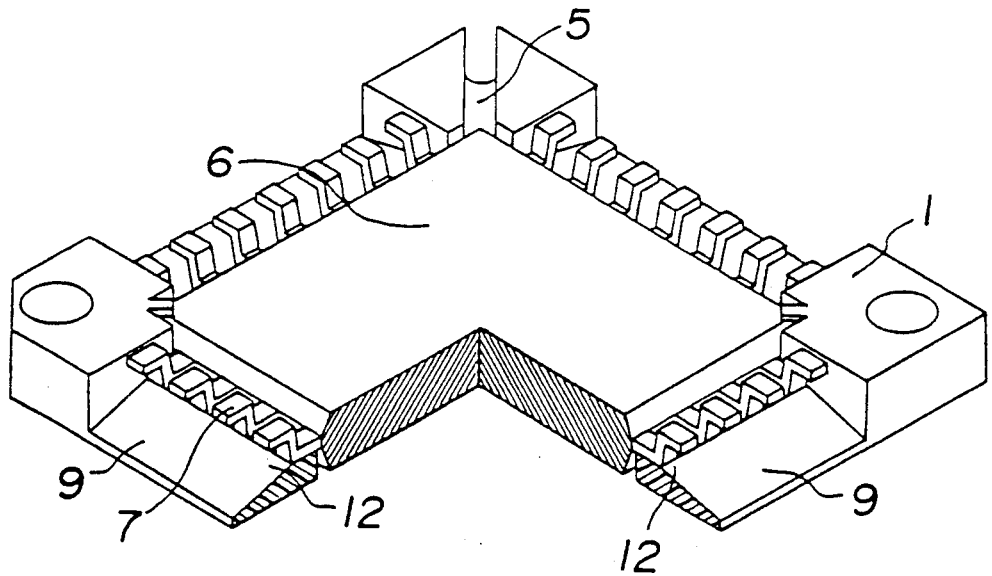
FIG. 2 is a perspective view of the above, in which an IC package is already held.
Figure 3:
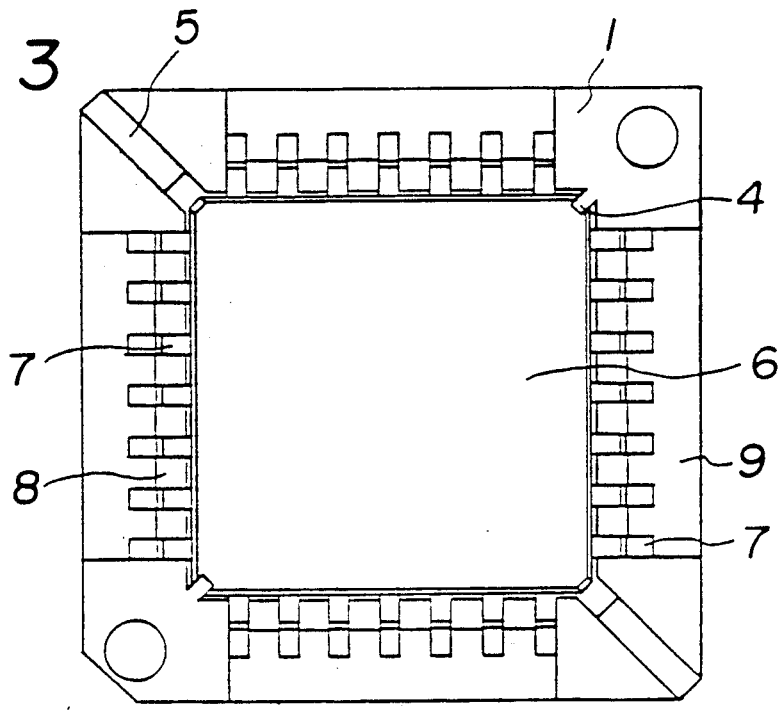
FIG. 3 is a plan view thereof.
Figure 4:
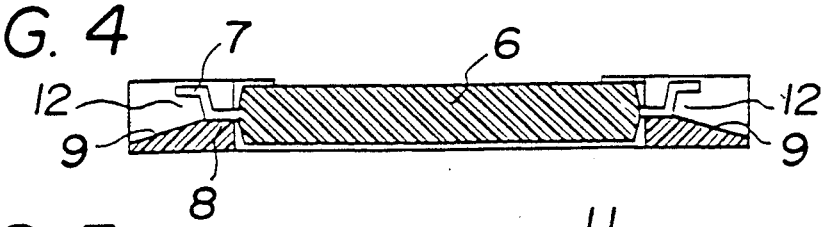
FIG. 4 is a sectional view thereof.
Figure 5:
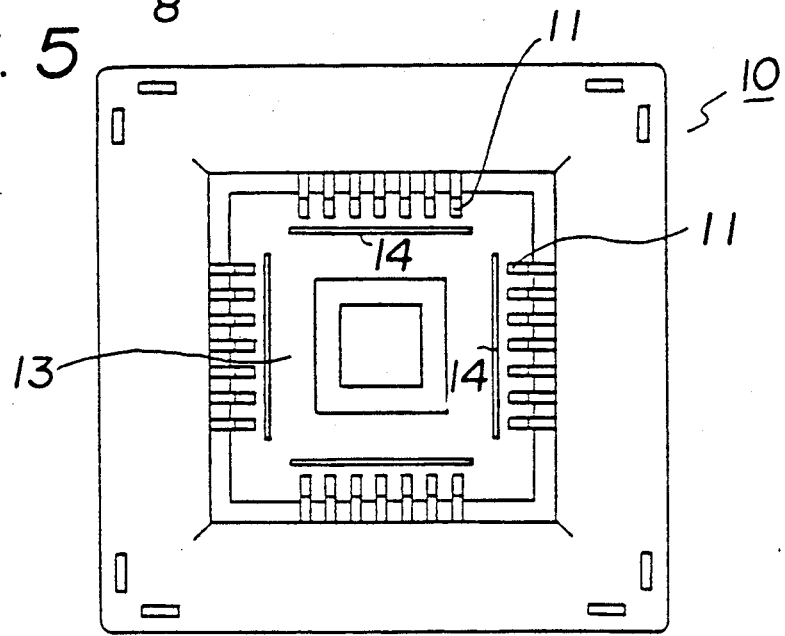
FIG. 5 is a plan view of an IC socket with the IC carrier mounted thereon.

As is shown in FIGS. 2 through 4, the IC package 6 is accommodated in the accommodating portion 3 of the IC carrier 1 and is carried by the IC carrier 1 with the retaining claws 4 engaged with the corners of the IC package 6. At the same time, while supporting the IC contact piece 7 on the contact piece supporting seat 8, a leading end portion of the IC contact piece 7 extends above the tapered portion 9 such that a space is formed between the tapered portion 9 and the leading end, so that a contact 11 of an IC socket 10, etc. can be inserted therein. That is, a contact insertion space 12 opening toward the outside of the frame is formed between the frame forming a contact piece 7. This insertion space 12 is also commonly used for obtaining contact between the contact 11 and the IC contact piece 7. The IC package 6 is restricted at its inner peripheral surface by an inner wall of the frame 2, to thereby properly establish the distance by which the IC contact piece 7 extends over the contact insertion space 12 in order to obtain a contact relation with the contact 11 inserted into the contact insertion space 12. Next, means for inserting this contact 11 into the contact insertion space 12 will be exemplified. FIGS. 5 through 7 show one example thereof. FIG. 5 is a plan view of the IC socket 10 on which the IC package 6 is placed so as to be held on the IC carrier 1, FIG. 6 is a side view thereof, and FIG. 7 is a sectional view thereof. Note that FIG. 7 is horizontally symmetric, and that the socket is divided into two halves. However, only one half is shown.

The IC socket 10 has a generally square IC carrier accommodating portion 13 formed in its central portion. Four sides of the IC carrier accommodating portion 13 are provided with positioning walls 14 for positioning the IC package 6 by restricting the peripheral surface thereof, and four peripheral sides of the IC carrier accommodating portion 13 are provided with elastic contacts for contacting the contact pieces 7 of the IC package 6.

Furthermore, contact shutter member 15 is vertically movably mounted on the IC socket 10 and adapted to move generally backwardly against the elasticity of the contact 11 so as to provide a pressing force from above against the contact 11.

FIG. 7 is a sectional view showing contact between the IC contact piece 7 of the IC package 6 held by the IC carrier 1 and the contact 11 of the IC socket 10. Although not illustrated, the contact shutter member 15 is pushed down first to elastically move the contact 11 generally backward into a position away from the contact insertion space 12, and in the foregoing state, the IC carrier 1 holding the IC package 6 is inverted and mounted on the IC carrier accommodating portion 13. Then, while the positioning walls 14 of the IC socket 10 restrict the movement of the IC package 6 held by the IC carrier 1 in such a posture as to face downward, the IC contact piece 7 is placed on the contact 11. The contact 11 has a contact piece 11b for contacting a lower surface of the IC contact piece in the state where the carrier 1 is mounted in its inverted state and another contact piece 11a for contacting an upper surface (surface adjacent the contact insertion space 12), so that the contact piece 11a is used to facilitate a smooth insertion and removal of the contact 11 into and from the contact insertion space 12. In this case, the contact piece 11b may be omitted.

Then, when the downward force applied to the contact shutter member 15 is removed, the contact 11 is returned in accordance with its elasticity, the contact piece 11a of the contact 11 is inserted into the contact insertion space 12, and a downward force is applied against the upper surface of the IC contact piece 7 in order to obtain a contacting relation. The IC package 6 is held on the socket 10 with the downwardly directed force of the contact 11, and the IC carrier 1 is indirectly held on the socket 10 by the package 6.

In order to cancel the contacting state between the contact 11 and the IC contact piece 7, downward force is applied to the contact piece 11a again to move the contact piece 11a of the contact 11 generally backwardly so as to move the contact piece 11a away from the contact insertion space 12 and the IC carrier 1 can be removed.

FIG. 8 is a perspective view, partly in section, of the IC carrier according to another embodiment of the present invention. Partition walls 16 to be inserted between contact pieces 7 of the IC package 6 are formed on the contact piece supporting seat 8. In this case, the IC package 7 and the IC carrier 1 may be positioned by the partition walls 16. A plurality of such partition walls 16 are preferably provided in such a manner that they are not inserted into all spaces between adjacent contact pieces 7 but are inserted only at important portions. Furthermore, it may also be designed such that the partition walls 16 are not only formed on the contact piece supporting seat 8 but also over the entire surface of the tapered portion 9 or it is formed only on the tapered portion 9. In case the partitions are formed on the tapered portion, the partition walls 16 are formed slender on the opening-up portion side and inclined, so that the contact insertion space 12 becomes larger toward the outside.

As described in the foregoing, if it is designed, as in the conventional device, such that a contact piece of an IC package held on an IC carrier is placed on a contact of a socket and the contact is bent by pressing against it with a presser cover in order to obtain a pressure contact depending solely on the pressing force, it is difficult to automate the opening and closing operation of the presser cover and the engaging and removing operation of the lock member. In addition, it has a disadvantage in that heat release of the IC is interrupted by the presser cover. However, according to the present invention, by virtue of the provision of a contact insertion space formed between a frame for supporting an IC contact piece and an IC contact piece, the contact is inserted into and removed from the contact insertion space and when inserted, the contact presses downwardly against the upper surface of the IC contact piece in order to obtain a contacting relation.

In this manner, the IC package can be held by the socket by way of the downwardly directed pushing force of the contact, the IC carrier can be held on the socket through the IC package, and the IC carrier can be held on the socket and a contact relation can be obtained without provision of a presser cover and a lock member which were needed in the prior art.

Also, as the contact can be inserted into and removed from the contact insertion space by utilizing its elasticity, such displacing operation can easily be performed by a robot, etc.

Although the present invention has been fully described by way of preferred embodiments thereof with reference to the accompanying drawings, it is to be understood that other variations and modifications will be apparent to those skilled in the art. Therefore, unless such changes and modifications otherwise depart from the true scope of the present invention, they should be construed as included therein.

What is claimed is:

1. An apparatus comprising:
   an IC package having a body and a plurality of contact pieces extending outwardly from said body; and
   an IC carrier frame having an IC package accommodating portion defined therein for accommodating said IC package and having an upper surface, said upper surface comprising a seat portion upon which respective portions of said IC package contact pieces are adapted to rest and a space defining portion extending outwardly from said seat portion with respect to said IC package accommodating portion;

said carrier frame and said body and contact pieces of said IC package being shaped and sized such that when said body of said IC package is accommodated in said IC package accommodating portion, respective inner portions of said contact pieces rest on said seat portion of said IC carrier frame upper surface and respective outer portions of said contact pieces extend over said space defining portion of said upper surface in spaced relationship therefrom, so as to form an insertion space between said space defining portion of said upper surface of said IC carrier frame and said outer portions of said contact pieces of said IC package, said insertion space being adapted for receipt of electrical contacts of an IC socket.

2. An apparatus as recited in claim 1, wherein said space defining portion of said upper surface of said IC carrier frame comprises an outwardly and downwardly sloping tapered portion.

3. An apparatus as recited in claim 2, wherein said contact pieces of said IC package are formed such that said inner portions which are adapted to rest on said seat portion of said IC carrier frame upper surface are offset downwardly with respect to said outer portions which are adapted to extend over said space defining portion of said IC carrier frame upper surface.

4. An apparatus as recited in claim 1, wherein said contact pieces of said IC package are formed such that said inner portions which are adapted to rest on said seat portion of said IC carrier frame upper surface are offset downwardly with respect to said outer portions which are adapted to extend over said space defining portion of said IC carrier from upper surface.

5. An apparatus as recited in claim 1, wherein said IC carrier frame is substantially rectangular.

6. An apparatus as recited in claim 1, wherein said IC carrier frame is substantially square.

7. An apparatus as recited in claim 1, wherein said body of said IC package is substantially rectangular.

8. An apparatus as recited in claim 1, wherein said body of said IC package is substantially square.

9. An apparatus comprising:

an IC package having a body and a plurality of contact pieces extending outwardly from said body;

an IC carrier frame having an IC package accommodating portion defined therein for accommodating said IC package and having an upper surface, said upper surface comprising a seat portion upon which respective portions of said IC package contact pieces are adapted to rest and a space defining portion extending outwardly from said seat portion with respect to said IC package accommodating portion;

an IC socket having an IC carrier frame accommodating portion for accommodating said IC carrier frame, and contact means for electrically contacting said contact pieces of said IC package when said IC package is accommodated in said IC package accommodating portion of said IC carrier frame and said IC carrier frame is accommodating in said IC carrier frame accommodating portion of said socket; and said carrier frame and said body and contact pieces of said IC package being shaped and sized such that when said body of said IC package is accommodated in said IC package accommodating portion, respective inner portions of said contact pieces rest on said seat portion of said IC carrier frame upper surface and respective outer portions of said contact pieces extend over said space defining portion of said upper surface in spaced relationship therefrom, so as to form an insertion space between said space defining portion of said upper surface of said IC carrier frame and said outer portions of said contact pieces of said IC package.

10. An apparatus as recited in claim 9, wherein said contact means of said IC socket comprises a plurality of resilient contacts and is operable to press against respective surfaces of said contact pieces which face said space defining portion of said IC carrier frame upper surface, when said IC package is accommodated in said IC package accommodating portion of said IC carrier frame and said IC carrier frame is accommodating in said IC carrier frame accommodating portion of said socket.

11. An apparatus as recited in claim 9, wherein said space defining portion of said upper surface of said IC carrier frame comprises an outwardly and downwardly sloping tapered portion.

12. An apparatus as recited in claim 11, wherein said contact pieces of said IC package are formed such that said inner portions which are adapted to rest on said seat portion of said IC carrier frame upper surface are offset downwardly with respect to said outer portions which are adapted to extend over said space defining portion of said IC carrier frame upper surface.

13. An apparatus as recited in claim 9, wherein said contact pieces of said IC package are formed such that said inner portions which are adapted to rest on said seat portion of said IC carrier frame upper surface are offset downwardly with respect to said outer portions which are adapted to extend over said space defining portion of said IC carrier frame upper surface.

* * * * *